United States Patent

Revitz et al.

[15] 3,641,402

[45] Feb. 8, 1972

[54] SEMICONDUCTOR DEVICE WITH BETA TANTALUM-GOLD COMPOSITE CONDUCTOR METALLURGY

[72] Inventors: Martin Revitz, Poughkeepsie; Francis E. Turene, Wappingers Falls, both of N.Y.

[73] Assignee: International Business Machines Corporation, Armonk, N.Y.

[22] Filed: Dec. 30, 1969

[21] Appl. No.: 889,203

[52] U.S. Cl. ........................317/234 R, 317/234 M, 204/192
[51] Int. Cl. ..........................................................H01l 1/14
[58] Field of Search ..............................................317/234 R

[56] References Cited

UNITED STATES PATENTS

| | | | |
|---|---|---|---|
| 3,310,711 | 3/1967 | Hangstefer | 317/234 |
| 3,529,350 | 9/1970 | Rairden | 317/234 |
| 3,567,508 | 3/1971 | Cox et al. | 317/234 |

*Primary Examiner*—Jerry D. Craig
*Attorney*—Hanifin and Jancin and Frank C. Leach, Jr.

[57] ABSTRACT

A deposited film of gold is adhered to a layer of silicon dioxide by a deposited film of Beta tantalum. After the gold is deposited on the Beta tantalum, a second film of Beta tantalum is deposited on the gold. This forms a composite sandwich adhering the gold to the silicon dioxide without decreasing the conductivity of the gold and allowing another layer of silicon dioxide to be adhered to the second film of Beta tantalum.

5 Claims, 4 Drawing Figures

INVENTORS
MARTIN REVITZ
FRANCIS E. TURENE

BY Frank C. Leach Jr.

ATTORNEY

SEMICONDUCTOR DEVICE WITH BETA TANTALUM-GOLD COMPOSITE CONDUCTOR METALLURGY

In forming the first level metallization for a semiconductor device, it is necessary to utilize a metal capable of conducting a high current density due to the thinness of the lands. The metal must be capable of adhering to the electrically insulating layer on which the metal is to be supported. The metal also must not have any effect on the various junctions formed within the substrate of the semiconductor device.

Gold has a high conductivity and is capable of conducting a high current density. Therefore, gold is a desirable metal for first level metallization. However, gold will not adhere to silicon dioxide so that gold cannot be employed directly by itself as the first level metallization.

It has previously been suggested to employ body-centered-cubic (b.c.c.) tantalum between gold and silicon dioxide since gold adheres to b.c.c. tantalum and b.c.c. tantalum adheres to silicon dioxide. Additionally, the tantalum makes intimate contact with the silicon substrate and the gold makes intimate contact with the tantalum so that the gold cannot affect the various junctions in the silicon substrate.

While the use of b.c.c. tantalum between gold and silicon dioxide overcomes the adherence problem, b.c.c. tantalum normally diffuses into gold when subjected to a temperature of about 400° C. for a period of time so as to cause an increase in the resistance of gold. Since the processing steps for forming the various levels of metallization in certain instances result in the b.c.c. tantalum film being subjected to a temperature of approximately 450° C. for a period of time, the efforts to utilize b.c.c. tantalum under these conditions as an adhesive material between gold and silicon dioxide have resulted in the resistance of gold increasing substantially due to diffusion between gold and b.c.c. tantalum. As a result of this substantial increase in resistance in gold, the advantage of the high conductivity of gold is lost in these instances. Therefore, while b.c.c. tantalum overcomes the adhesion problem between gold and silicon dioxide, it cannot be employed in some instances due to gold ceasing to have the desired high conductivity that is required for gold to be used as interconnection stripes.

The present invention satisfactorily solves the foregoing problem by using Beta tantalum as the adhering film between gold and silicon dioxide. Tests have disclosed that the use of Beta tantalum does not have a substantial effect on the conductivity of gold in comparison with that produced by b.c.c. tantalum. Therefore, the present invention overcomes the problem of adhering gold to silicon dioxide without causing gold to lose its desired conductivity.

When gold is adhered to silicon dioxide by Beta tantalum in accordance with the method of the present invention, the conductivity of gold is not changed substantially at temperatures at which the various levels of metallization are deposited or formed on the substrate. This temperature is approximately 450° C.

An object of this invention is to provide a semiconductor device employing gold as a conductor.

The foregoing and other objects, features, and advantages of the invention will be more apparent from the following more particular description of the preferred embodiment of the invention as illustrated in the accompanying drawings.

Figure 1:
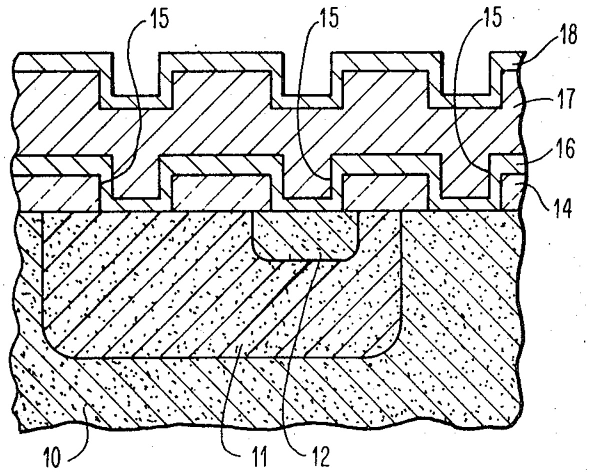
FIG. 1 is a sectional view of a portion of a semiconductor device having gold adhered to an electrically insulating layer by the method of the present invention before etching of the films.

Referring to the drawings and particularly FIG. 1, there is shown a substrate 10 of a semiconductor material such as silicon of N-type conductivity. The substrate 10 can function as the collector of a transistor, for example.

A P region 11 is formed in the substrate 10 by diffusion in the well-known manner through an opening in a layer 14 of silicon dioxide, for example. The region 11 functions as the base of the transistor.

After reoxidation to close the opening used for diffusion of the region, an N+ region 12 is formed in the region 11 by diffusion in the well-known manner through an opening in the layer 14 of silicon dioxide. The region 12 can function as the emitter of the transistor.

The layer 14 of silicon dioxide may be formed on the substrate surface having the regions 11 and 12 diffused therein by thermally growing the silicon dioxide, for example, or pyrolytically depositing the silicon dioxide on the substrate 10. Both of these techniques are well known.

After diffusion of the region 12, reoxidation occurs to close the opening used for diffusion of the region 12. Openings 15 are then formed in the layer 14 for communication with the substrate 10 and the regions 11 and 12. Then, a film 16 of Beta tantalum is deposited over the layer 14 of silicon dioxide and into the openings 15. The film 16 of Beta tantalum is preferably deposited by DC sputtering.

After the film 16 of Beta tantalum has been deposited on the layer 14 of silicon dioxide, a film 17 of gold is deposited on the film 16 of Beta tantalum. The film 17 of gold is preferably deposited on the film 16 of Beta tantalum by DC sputtering and within the same sputtering chamber.

The film 17 of gold extends into the openings 15 in the layer 14 of silicon dioxide to make contact through the film 16 of Beta tantalum with the substrate 10 and the regions 11 and 12. The film 16 of Beta tantalum is preferably relatively thin in comparison with the film 17 of gold. The film 16 of Beta tantalum may be 1,500 A. while the film 17 of gold is 7,500 A., for example.

After the film 17 of gold has been deposited on the film 16 of Beta tantalum, another film 18 of Beta tantalum is deposited on the film 17 of gold. The film 18 enables another layer (not shown) of silicon dioxide to be deposited thereon and adhered thereto to form the electrically insulating layer on which second level metallization may be deposited.

Figure 2:
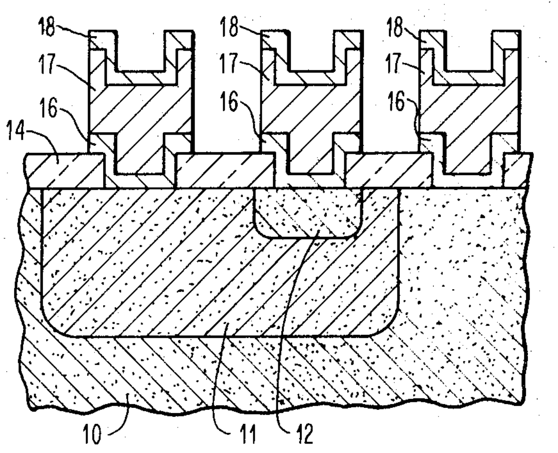
FIG. 2 is a sectional view, similar to FIG. 1, after etching.

Of course, before the second layer of silicon dioxide is deposited on the film 18 of Beta tantalum, each of the films 16, 17, and 18 is etched by a suitable etchant to form the desired interconnection stripes, for example. This results in separate portions of the films 16, 17, and 18 making contact with the substrate 10 and the regions 11 and 12 as shown in FIG. 2.

Figure 4:
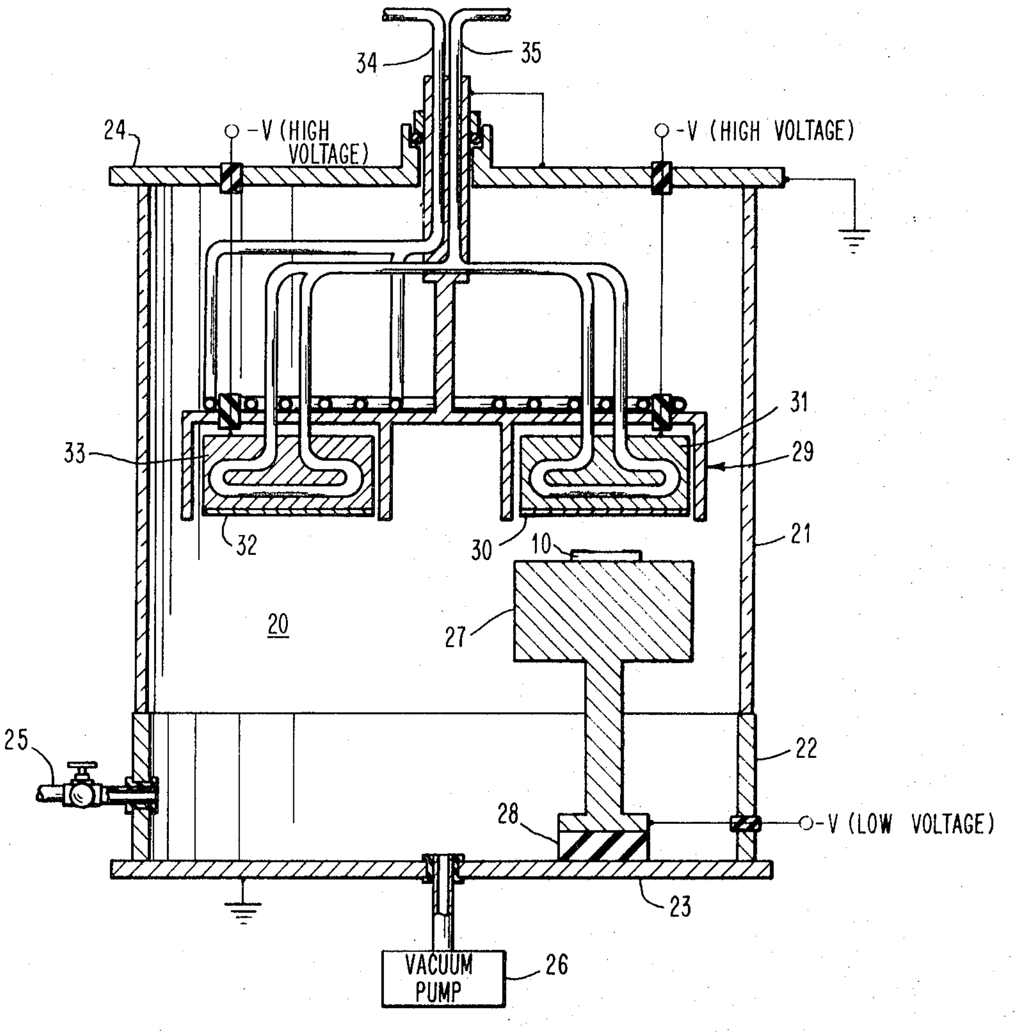
FIG. 4 is a schematic vertical sectional view of a DC sputtering apparatus for carrying out the method of the present invention.

Any suitable means for depositing the films 16, 17, and 18 may be employed. One suitable example of a DC sputtering apparatus for carrying out the method of the present invention is shown in FIG. 4.

The DC sputtering apparatus includes a low-pressure gas ionization chamber 20, which is formed within a bell jar 21, a metallic collar 22, a metallic base 23, and a metallic top plate 24. Suitable gaskets (not shown) would be disposed between the jar 21 and the top plate 24, the jar 21 and the collar 22, and the collar 22 and the base 23 to provide a vacuum seal.

A suitable inert gas such as argon, for example, is supplied to the chamber 20 from a suitable source by a conduit 25. The gas is maintained at a desired low pressure within the chamber 20 by a vacuum pump 26, which communicates with the interior of the chamber 20.

A substrate holder 27 is supported by the base 23 but in spaced relation thereto through an electrically insulating member 28. The substrate holder 27 supports the substrate 10 thereon. A negative voltage biases the substrate 10 through being applied to the holder 27.

A cathode shield 29 is rotatably supported by the top plate 24 of the chamber 20. A target 30 of tantalum is supported from a block 31, which is carried by the shield 29 by means (not shown). A high negative voltage is applied to the target 30 through being supplied to the support block 31.

A target 32 of gold is supported by a second support block 33. The support block 33 also is supported by the cathode shield 29 by means (not shown). A high negative DC voltage also is supplied to the target 32 by being applied to the block 33.

Coolants may be supplied through tubes 34 and 35 to cool the cathode shield 29 and the support blocks 31 and 33. Water may be employed as the coolant for the cathode shield 29 while kerosene may be used for cooling the target support blocks 31 and 33.

By rotating the cathode shield 29, either of the targets 30 and 32 can be disposed above the substrate 10. In carrying out the method of the present invention, the target 30 of tantalum is initially disposed above the substrate 10. With a negative potential applied only to the target 30 of tantalum and not to the target 32 of gold and with the target 30 of tantalum disposed above the substrate 10, the tantalum of the target 30 is sputtered onto the surface of the substrate 10.

After the tantalum of the target 30 has been sputtered onto the substrate 10 to form the first film 16 of tantalum on the substrate 10, the cathode shield 29 is rotated to dispose the target 32 of gold above the substrate 10. At this time, the negative potential is applied only to the target 32 of gold and not to the target 30 of tantalum. This causes sputtering of the film 17 of gold on the film 16 of tantalum.

After the film 17 of gold has been deposited, the shield 29 is again rotated to the position of FIG. 4 wherein the target 30 of tantalum is disposed above the substrate 10. At this time, the negative potential is again applied only to the target 30 of tantalum and not to the target 32 of gold whereby the second film 18 of tantalum is deposited on the film 17 of gold.

To obtain Beta tantalum, it is necessary to control the negative potential of the cathode target of tantalum. Thus, by increasing the potential of the cathode target of tantalum, the deposited film of tantalum will be Beta tantalum rather than b.c.c. tantalum.

These samples A, B, and C were prepared on three separate wafers with each wafer having a layer of silicon dioxide thermally grown thereon. Each of the three samples had a first film of tantalum of 1,500 A. thickness deposited thereon, then a film of gold of 7,500 A. thickness deposited on the tantalum, and finally a second film of tantalum of 1,500 A. thickness deposited on the gold.

Each of the samples had these three films deposited by DC sputtering through being disposed within a sputtering chamber such as the chamber 20 with the targets of tantalum and gold each having an area of 16 square inches. The initial vacuum was $1 \times 10^{-6}$ torr and then the chamber 20 was backfilled with argon to approximately 40 microns of pressure. Each of the samples had an anode potential of −90 volts throughout the deposition of each of the films of tantalum and the film of gold.

In forming sample A, a sputtering power of 50 watts was applied during deposition of each of the films of tantalum by supplying a current of 33.3 milliamps at a voltage of 1.5 kilovolts. This provided a power density of 3.125 watts/in.$^2$. During the deposition of the gold film, the sputtering power was 60 watts with this being applied through supplying a current of 40 milliamps at a voltage of 1.5 kilovolts. This provided a power density of 3.75 watts/in.$^2$.

In forming sample B, the sputtering power during the deposition of the two films of tantalum was increased to 75 watts. This was accomplished by supplying a current of 50 milliamps at a voltage of 1.5 kilovolts. This provided a power density of 4.6875 watts/in.$^2$. The sputtering power of the gold was the same 60 watts as used in depositing gold in forming sample A.

In forming sample C, the sputtering power was 200 watts during the deposition of each of the tantalum films. The sputtering power was provided by supplying a current of 100 milliamps with a voltage of 2 kilovolts. This provided a power density of 12.5 watts/in.$^2$. The gold was applied with a sputtering power of 60 watts in the same manner as for samples A and B.

By X-ray diffraction techniques, it was determined that each of the films of tantalum of sample A was b.c.c. tantalum while each of the films of tantalum of each of samples B and C was Beta tantalum.

Samples A, B, and C were then deposited in a furnace having a reducing atmosphere of hydrogen and nitrogen therein and heated to a temperature of 450° C. At different time intervals during the heating period, the samples were cooled by the reducing atmosphere and then removed from the furnace. The sheet resistance of each of the samples A, B, and C was then determined. After each sheet resistance determination, the samples were returned to the furnace for further heating.

The sheet resistance of each of the samples was determined by using a four point probe system. The current was supplied through two of the probes and the voltage drop measured through the other two probes in the well-known manner.

Since the resistivity of deposited tantalum is 50 to 100 times as great as the resistivity of the deposited gold and the measurement of the sheet resistance by the probes is a measurement of the resistances of the films in parallel, the measured sheet resistance is effectively the sheet resistance of the gold.

The sheet resistance in milliohms per square of each of the samples A, B, and C at different time intervals is shown in the following table:

| Time in Hours | A | B | C |
|---|---|---|---|
| 0 | 32.2 | 31.0 | 34.0 |
| 0.57 | 38.3 | 33.5 | 35.7 |
| 1.33 | 40.8 | 34.3 | 36.2 |
| 2.33 | 42.6 | 35.1 | 37.6 |
| 4.08 | 44.2 | 36.4 | 38.5. |

The difference between the sheet resistance, $R_0$, at 0 hours and each of the other time readings is indicated as $R_d$. The ratio of $R_d$ to $R_o$ multiplied by 100 gives the percent change in the resistance from $R_o$ and is shown in FIG. 3.

Figure 3:
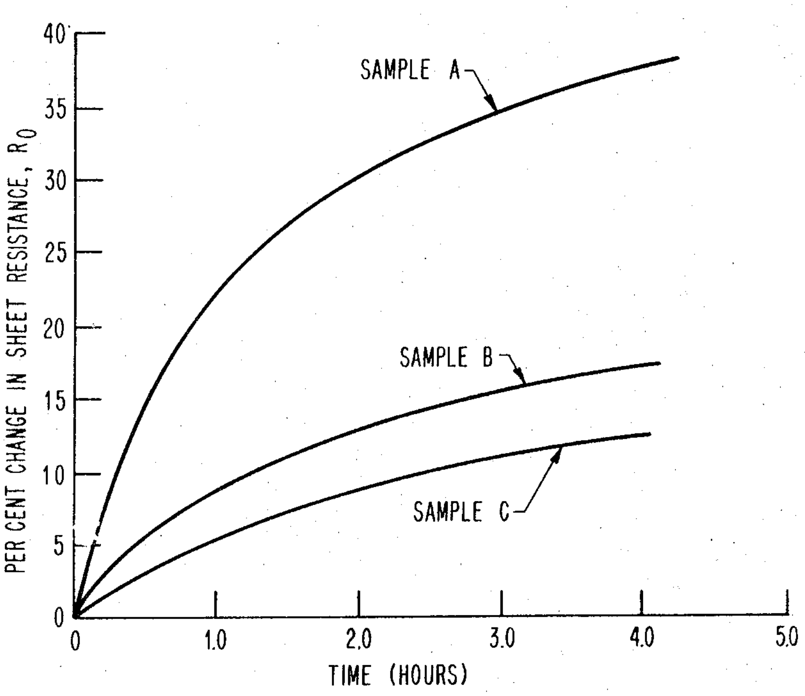
FIG. 3 shows curves illustrating the relationship between the change in sheet resistance of various composite sandwiches at different time intervals when subject to a temperature of 450° C.

As shown in FIG. 3, the curve for sample A shows a high change in sheet resistance after sample A has been subjected to a temperature of 450° C. for less than one hour. Thus, the sheet resistance increased over 15 percent in 30 minutes. This curve shows that b.c.c. tantalum does not prevent diffusion between the gold and tantalum whereby the resistance of the gold would be substantially affected. As indicated by the curve for sample A, the conductivity of the gold when utilized with b.c.c. tantalum produces an ineffective conductor because of the increased resistance of the gold.

For both samples B and C, the increase in sheet resistance is much lower. For example, after being subjected to a temperature of 450° C. for 30 minutes, the sheet resistance of sample C is increased only 4 percent. Furthermore, the increase in sheet resistance after 4 hours is about 12 percent. Therefore, when gold is adhered to silicon dioxide by Beta tantalum, the resistance of the gold is not affected significantly so that it maintains its desired conductivity.

While the present invention has shown and described the electrically insulating layer as being formed of silicon dioxide, it should be understood that the present invention may be employed with any type of insulating layer such as silicon nitride, for example. Likewise, it is not necessary that the substrate be formed of silicon.

While the present invention has described the films of gold and tantalum as being deposited by DC sputtering, it should be understood that any other type of deposition means could be employed. Furthermore, it is not necessary that the same type of deposition means be employed to deposit the gold as is utilized to deposit the tantalum.

While it has not been shown or described, it should be understood that the tantalum makes contact with a thin film of platinum silicide in the well-known manner rather than directly with the silicon.

An advantage of this invention is that good adhesion of gold to an electrically insulating layer is obtained by an adhering metal without diffusion of the adhering metal into gold. Another advantage of this invention is that the resistance of gold, which is deposited by the method of the present invention, is retained at substantially the same level during all metallization processes for forming a semiconductor device.

During fabrication it is essential that the gold be positively separated from silicon. The tantalum layer is to some extent porus and may allow the gold to alloy with Si during subsequent heat treatments. The lower tantalum layer can be made more effective as a barrier by exposure to air prior to gold deposition. The results in a very thin oxide which fills in possible openings in the tantalum. The resultant oxide will not materially affect the adhesion of gold to tantalum.

While the invention has been particularly shown and described with reference to a preferred embodiment thereof, it will be understood by those skilled in the art that various changes in form and details may be made therein without departing from the spirit and scope of the invention.

What is claimed is:

1. A semiconductor device comprising:

a substrate of one conductivity;

at least one region of opposite conductivity to said substrate formed in said substrate and communicating with a surface of said substrate;

an insulating layer over the surface of said substrate having said region in said substrate communicating therewith, said insulating layer having an opening therein to provide communication to said region;

a film of Beta tantalum deposited on said insulating layer and extending into said opening for contact with said region;

a film of gold deposited on said film of Beta tantalum and extending into said opening to make ohmic contact with said region through said film of Beta tantalum in said opening;

and a second film of Beta tantalum deposited on said film of gold for receiving another insulating layer thereon.

2. The device according to claim 1 in which said substrate is silicon.

3. The device according to claim 2 in which said insulating layer is silicon dioxide.

4. The device according to claim 1 in which said insulating layer is silicon dioxide.

5. The device according to claim 1 in which a thin film of oxide is deposited on said film of Beta tantalum prior to deposition of said film of gold.

* * * * *